United States Patent
Cai et al.

(10) Patent No.: US 7,808,039 B2
(45) Date of Patent: Oct. 5, 2010

(54) SOI TRANSISTOR WITH MERGED LATERAL BIPOLAR TRANSISTOR

(75) Inventors: Jin Cai, Cortlandt Manor, NY (US); Jeffrey B. Johnson, Essex Junction, VT (US); Tak H. Ning, Yorktown Heights, NY (US); Robert R. Robison, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/099,879

(22) Filed: Apr. 9, 2008

(65) Prior Publication Data

US 2009/0256204 A1    Oct. 15, 2009

(51) Int. Cl.
    *H01L 27/088*    (2006.01)
(52) U.S. Cl. .................. 257/328; 257/367; 257/406; 438/209; 438/328
(58) Field of Classification Search .............. 257/328, 257/367, 408; 438/208, 328, 983
    See application file for complete search history.

(56) References Cited

U.S. PATENT DOCUMENTS

| | | | |
|---|---|---|---|
| 5,185,280 A | | 2/1993 | Houston et al. |
| 5,338,960 A | * | 8/1994 | Beasom ...................... 257/335 |
| 5,936,278 A | * | 8/1999 | Hu et al. ..................... 257/336 |
| 5,977,591 A | * | 11/1999 | Fratin et al. .................. 257/344 |
| 6,232,163 B1 | * | 5/2001 | Voldman et al. ............ 438/212 |
| 6,452,233 B1 | * | 9/2002 | Masuda ....................... 257/349 |
| 6,541,822 B2 | | 4/2003 | Bae et al. |
| 6,645,820 B1 | * | 11/2003 | Peng et al. .................. 438/372 |
| 6,746,937 B2 | | 6/2004 | Beaman |
| 6,828,632 B2 | * | 12/2004 | Bhattacharyya ............. 257/347 |
| 6,969,618 B2 | | 11/2005 | Mouli |
| 7,138,313 B2 | * | 11/2006 | Chatty et al. ................ 438/237 |
| 7,211,473 B1 | | 5/2007 | Pelella et al. |
| 7,217,602 B2 | | 5/2007 | Koh |
| 7,268,022 B2 | | 9/2007 | Bhattacharyya |

OTHER PUBLICATIONS

Small Geometry Depleted Base Bipolar Transistors (BSIT)—VLSI Devices; J.M.C. Stork & James D. Plummer; 1981; IEEE.
Bess: A Structure that Fully Suppresses the Floating Body Effects in SOI CMOSFETs; Masatada Horiuchi & Masao Tamura; 1996; IEEE.
Bess: A Structure that Fully Suppresses the Floating Body Effects in SOI CMOSFETs; Masatada Horiuchi & Masao Tamura; 1998; IEEE.

* cited by examiner

*Primary Examiner*—Long Pham
*Assistant Examiner*—Steven H Rao
(74) *Attorney, Agent, or Firm*—Robert M. Trepp, Esq.; Steven M. Greenberg, Esq.; Carey Rodriguez Greenberg & Paul LLP

(57) ABSTRACT

A semiconductor-on-insulator transistor device includes a source region, a drain region, a body region, and a source-side lateral bipolar transistor. The source region has a first conductivity type. The body region has a second conductivity type and is positioned between the source region and the drain region. The source-side lateral bipolar transistor includes a base, a collector, and an emitter. A silicide region connects the base to the collector. The emitter is the body region. The collector has the second conductivity type, and the base is the source region and is positioned between the emitter and the collector.

19 Claims, 4 Drawing Sheets

SOI TRANSISTOR WITH MERGED LATERAL BIPOLAR TRANSISTOR

BACKGROUND OF THE INVENTION

1. Field of the Invention

The disclosure relates generally to transistor devices and, more specifically, to Semiconductor-On-Insulator (SOI) transistors.

2. Description of the Related Art

Referring to FIG. 1, a conventional partially-depleted (PD) SOI field-effect transistor (FET) 10 is illustrated. The transistor 10 includes a source region 12 and a drain region 14 with a body 18 in between. A gate insulator 24 is positioned between a gate 16 and at least the body 18. Isolation regions 22 electrically isolate the transistor 10, and the transistor 10 is formed over a buried oxide/insulator layer 20, which is positioned over a silicon substrate (not shown).

In the PD SOI FET 10, a portion of the body region 18 above the buried oxide layer 20 is considered to be quasi-neutral, and the rest of the body region 18 is considered to be depleted. For an n-channel FET (nFET), this body region 18 is p-type. The body region 18 of a PD SOI device 10 is considered to be floating. The body region 18 is electrically isolated at the top by the gate insulator 24, at the bottom by the buried oxide layer 20, horizontally parallel to the direction of FET current flow or the channel length direction (as shown in FIG. 1) by the heavily doped n-type source and drain regions, and horizontally perpendicular the direction of FET current flow (not shown) by the isolation regions (e.g., shallow-trench isolation).

Whereas in bulk FETs, the device body is capable of being biased at an arbitrary voltage relative to the source region, with a typical PD SOI FET 10, the device body 18 is not tied to any voltage. As such, the device body 18 may acquire a voltage different than that of the source region 12. This characteristic is know as "floating-body effect" in a PD SOI FET 10, and in certain instances, has negative effects on the device 10 and the circuit in which the device 10 is positioned. Therefore, to minimize floating-body effect in a PD SOI FET 10, keeping the body voltage close to the source region voltage is desirable.

Many techniques for reducing floating-body effect in a PD FET have been proposed. One common technique involves providing an electrical connection to the device body by expanding the device body region and electrically connecting to the device body. Although this technique can control the device body voltage, the cost of this technique is significant due to larger device area and a larger associated parasitic capacitance.

Referring to FIG. 2, in a conventional PD SOI FET 10, the physical mechanism governing the device body voltage $V_b$ is the net accumulation of majority charge in the quasi-neutral device body region 18. For an nFET 10, this is the accumulation of holes on the p-type device body region 18. For purposes of illustration, the PD SOI nFET 10 is assumed to have a gate voltage $V_g$ and source region $V_s$ of 0 volts. The drain region voltage is assumed to be at a positive voltage of $V_{dd}$. Assuming a gate voltage $V_g$ of 0 volts, the FET 10 is in an off state.

With the FET 10 in the off state, no electron channel current flows directly from source region 12 to the drain region 14. Instead, the electron flow from the source region 12 to the drain region 14 is indirect. For example, electrons flow from the source n+ region 12 to the p-type device body 18, and electrons flow from the p-type device body 18 to the drain n+ region 14. With the drain region 14 at $V_{dd}$ and the source region 12 at 0 volts, the device body 18 acquires a voltage $V_b$ between 0 and $V_{dd}$. Thus, the drain-body diode 34 is reverse-biased while the source-body diode 32 is forward biased. The body voltage $V_b$ is also the source-body forward bias voltage.

Associated with the reverse-biased body-drain diode 34 is a leakage current, which is caused by electrons flowing towards (and being collected by) the n+ drain region 14 and holes flowing towards (and being collected by) the p-type body region 18. In the forward-biased source-body diode 32, a forward-diode current is caused by electrons being injected from the n+ source region 12 into the p-type body 18 and holes being injected from the p-type body 18 into the n+ source region 12.

As holes are collected in the p-type device body 18, the body voltage $V_b$ rises. However, as the body voltage $V_b$ rises, the source-body diode 32 becomes more forward biased and the hole injection from the p-type body 18 into the n+ source 12 region increases. A steady state body voltage $V_b$ is reached when the hole current flowing into the device body 18 on the drain side is balanced by the hole current flowing out of the device body 18 on the source side.

Referring to FIG. 3, the top portions 42, 44 of the source and drain regions 12, 14 are typically silicided to provide good electrical contact to the source and drain regions 12, 14. In the forward-biased source-body diode 32, the holes injected from the p-type body 18 into the n+ source region 12 recombine within the n+ region and at the silicide contact 42. That is, the hole current is a recombination current. The body voltage $V_b$ rises when this recombination current is not large enough to prevent significant hole accumulation in the p-type body 18.

BRIEF SUMMARY OF THE INVENTION

Embodiments of the invention provide a novel and non-obvious semiconductor-on-insulator transistor device for reducing body voltage. The SOI transistor device includes a source region, a drain region, a body region, and a source-side lateral bipolar transistor. The source region has a first conductivity type. The body region has a second conductivity type and is positioned between the source region and the drain region. The source-side lateral bipolar transistor includes a base, a collector, and an emitter. A silicide region connects the base to the collector. The emitter is the body region. The collector has the second conductivity type as the body region, and the base is the source region and is positioned between the emitter and the collector.

In another embodiment of the invention, the SOI transistor device includes a source region, a drain region, a body region, and a source-side lateral bipolar transistor. The source region has a first conductivity type. The body region has a second conductivity type and is positioned between the source region and the drain region. The source-side lateral bipolar transistor includes a base, a collector, and an emitter. A silicide region connects the base to the collector. The source region includes an upper region and a first punchthrough region. The upper region has the first conductivity type, and the first punchthrough region has the first conductivity type with a lower doping density than the upper region or has the second conductivity type. A second punchthrough region may be positioned within the drain region.

In yet another embodiment of the invention, the SOI transistor device includes a source region, a drain region, a body region, and source-side and drain-side lateral bipolar transistors. Each of the lateral bipolar transistors include a base, a collector, and an emitter.

Additional aspects of the invention will be set forth in part in the description which follows, and in part will be obvious from the description, or may be learned by practice of the invention. The aspects of the invention will be realized and attained by means of the elements and combinations particularly pointed out in the appended claims. It is to be understood that both the foregoing general description and the following detailed description are exemplary and explanatory only and are not restrictive of the invention, as claimed.

BRIEF DESCRIPTION OF THE SEVERAL VIEWS OF THE DRAWINGS

The accompanying drawings, which are incorporated in and constitute part of this specification, illustrate embodiments of the invention and together with the description, serve to explain the principles of the invention. The embodiments illustrated herein are presently preferred, it being understood, however, that the invention is not limited to the precise arrangements and instrumentalities shown, wherein.

DETAILED DESCRIPTION OF THE INVENTION

Figure 1:
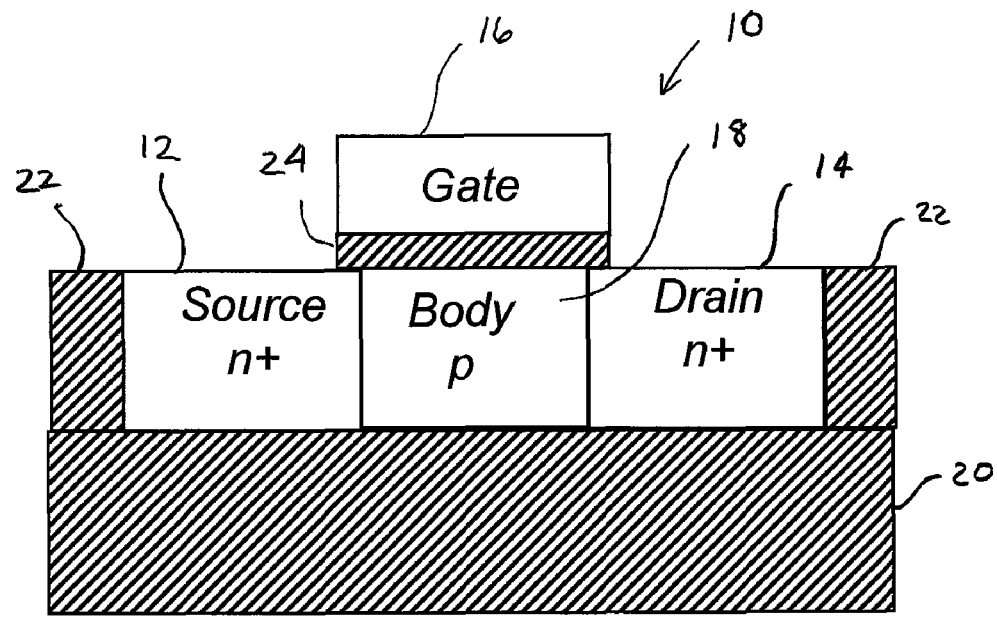
FIG. 1 is a cross-sectional view of a conventional SOI transistor.
Figure 2:
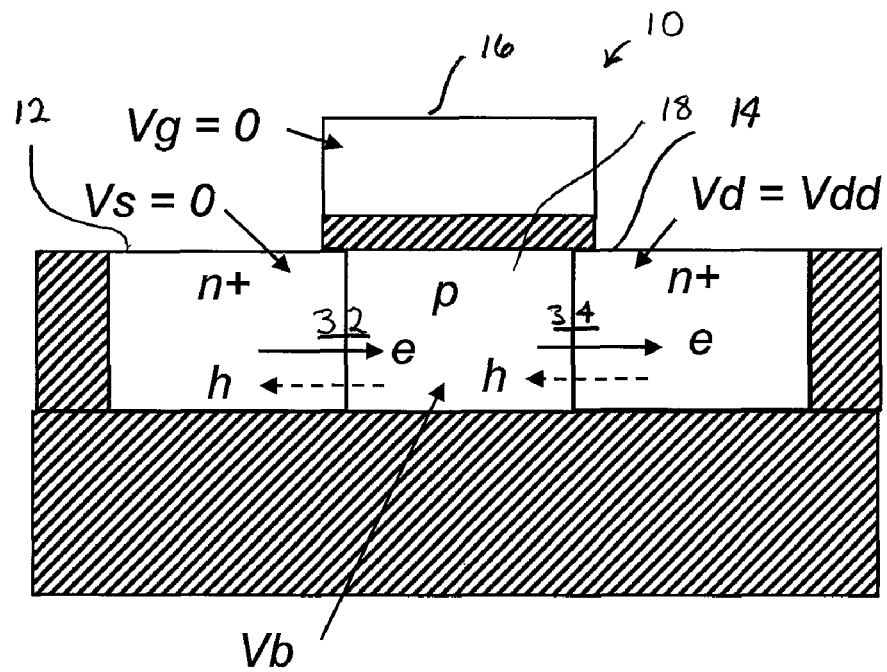
FIG. 2 is a cross-sectional view of the conventional SOI transistor showing hole and electron movement.
Figure 3:
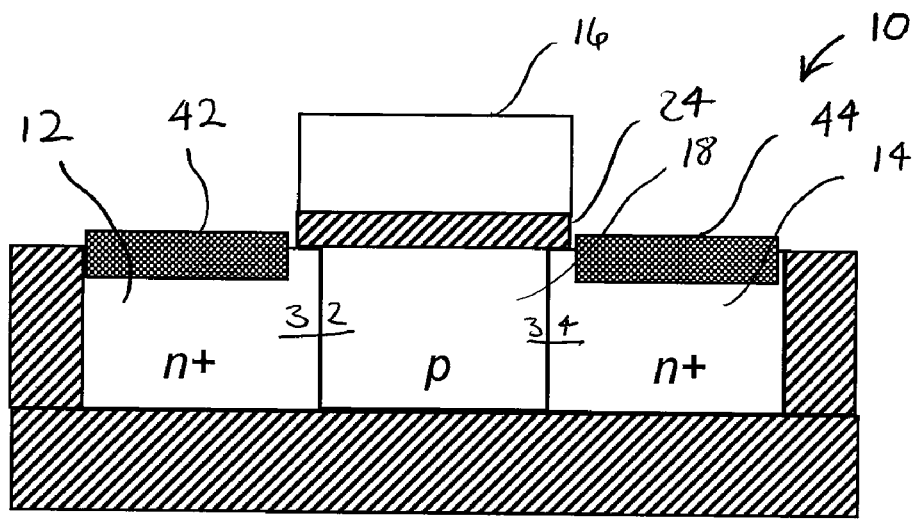
FIG. 3 is a cross-sectional view of the convention SOI transistor including silicided regions.
Figure 4:
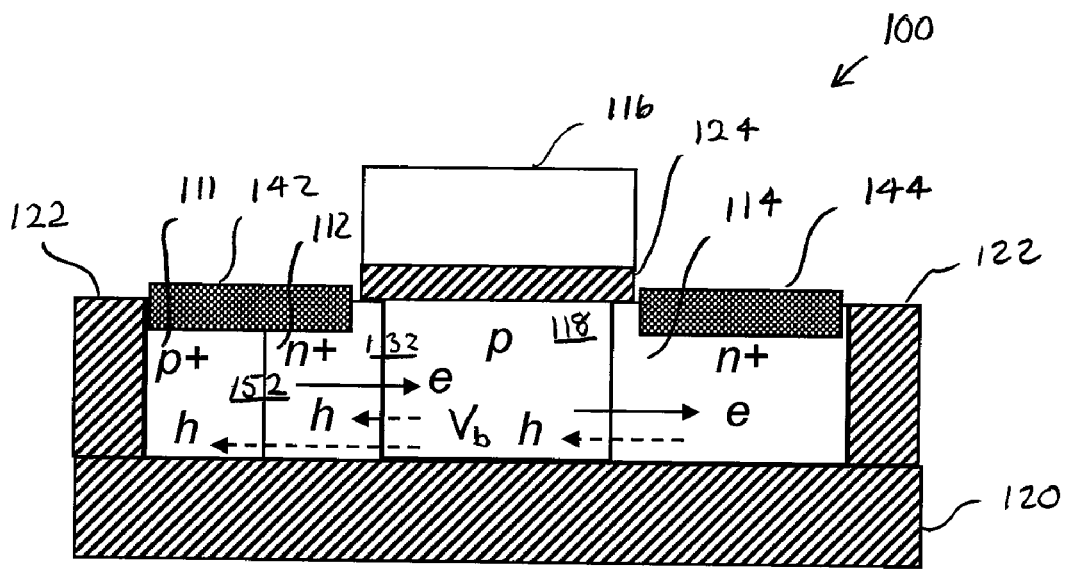
FIG. 4 is a cross-sectional view of a SOI transistor included a merged lateral bipolar transistor, in accordance with the inventive arrangements.

Referring to FIG. 4, a PD SOI FET 100 with a merged lateral bipolar transistor 152 is illustrated. Similar to a conventional SOI FET 10, the SOI FET 100 includes source and drain regions 112, 114 surrounding a body 118. Also, a gate insulator 124 is positioned between a gate 116 and at least the body 118. Isolation regions 122 electrically isolate the transistor SOI FET 100. The transistor 100 is formed over a buried oxide/insulator layer 120, which is positioned over a silicon substrate (not shown). Although FIGS. 4-7 are discussed with regard to n-channel FETs, the disclosure is not limited in this manner. As is readily recognized, the same concepts can be applied to an SOI p-channel FET.

The merged lateral bipolar transistor 152 is formed using the source region 112 as a base. A collector region 111 and the source/base region 112 are electrically shorted together by the source silicide region 142. The collector region 111 is doped with the same conductivity type as the device body 118 and is located between the source region 112 and the isolation device 122. The body 118 acts as the emitter of the lateral bipolar transistor 152.

The SOI device is not limited as to the type of material used to fabricate the device. For example, the semiconductor layer above the buried insulator where the transistors are built and the substrate below the buried insulator can be formed from any semiconductor material suitable for forming a SOI device. Although silicon is currently the most commonly used semiconductor material to form SOI, other semiconductor materials include germanium, silicon-germanium alloys, and semiconductor materials that can be grown on top of silicon, germanium, or silicon-germanium alloys.

The merged lateral bipolar transistor 152 on the source side operates to suppress the floating-body effect. As the body voltage $V_b$ rises (caused by holes originating from the drain-body diode leakage current being collected in the p-type body 118), the source-body diode 132 is forward biased. As the source-body diode 132 is forward biased, holes are injected from the p-type body 118, which is the emitter of the lateral bipolar transistor 152, into the n-type source region 112, which is the base of the lateral bipolar transistor 152.

The injected holes give rise to two current components: a recombination current component and a collector current component. The recombination current is due to holes that recombine within the n-type source region 112 or at the contact with the silicide region 142, and the collector current is due to holes that reach the p-type collector region 111. In comparison to a conventional SOI nFET 10, the present SOI nFET 100 includes the additional collector current. With the n+ doping profile of the source region 112, recombination is not favored.

The magnitude of the collector current is a function of the design of the n-type source/base region 112. For example, collector current can be increased by narrowing the separation (i.e., the source/base region 112) between the collector p-type region 111 and the p-type body region 118. Also, if the doping concentration of the source/base region 112 is reduced, the collector current is increased. By modifying the source/base region 112 to increase the collector current, the net accumulation of holes in the p-type body 118 can be substantially reduced (i.e., holes accumulated in the p-type floating body 118 are drained away).

The increase in collector current can advantageously suppress a rise in the body voltage $V_b$ without substantially affecting the characteristics of the SOI nFET 100. Moreover, the suppression of the body voltage $V_b$ can be accomplished with little to no area penalty and with little to no additional costs as a result of additional processing steps.

Figure 5:
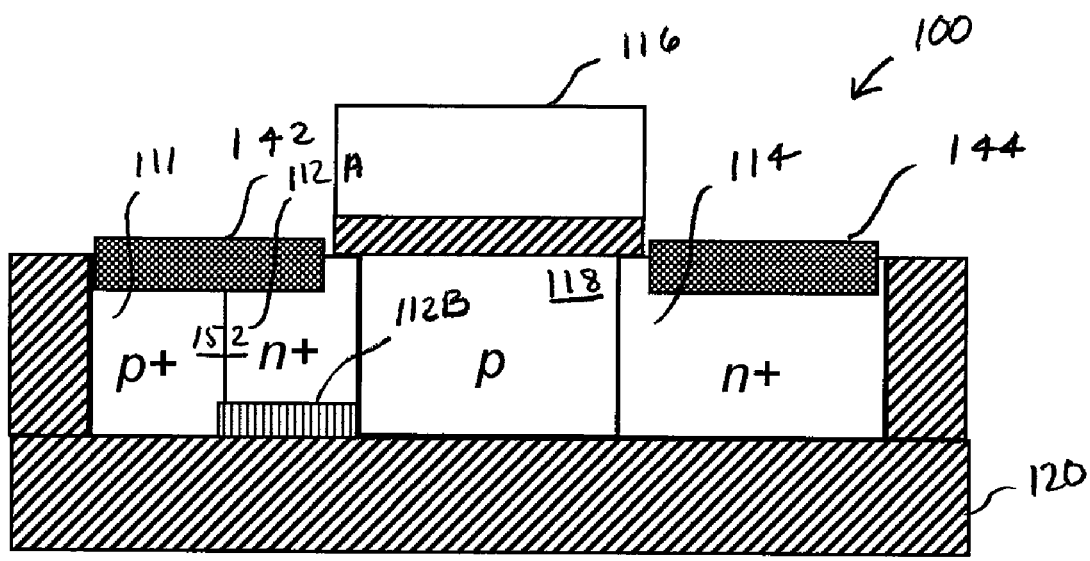
FIG. 5 is a cross-sectional view of a SOI transistor having a source-side merged lateral bipolar transistor and a punchthrough region in the base of the merged lateral bipolar transistor, in accordance with the inventive arrangements.

Referring to FIG. 5, an alternative embodiment of the SOI nFET 100 is illustrated. To further increase the collector current, the source/base region 112 can comprise two distinct regions 112A, 112B. This can be accomplished by modifying a vertical doping profile of the source/base region 112. For example, the upper region 112A can have a typical n+ source region doping profile. However, the lower region 112B can be modified to be a lightly-doped (i.e., lower doping density) n-type region (e.g., by not deeply implanting the n-type implants) or a lightly-doped depleted p-region (i.e. a p-type doped region that is sufficiently lightly-doped with no appreciable quasi-neutral p-region).

Although the manner in which the two distinct regions 112A, 112B are formed is not limited to a particular technique, these regions 112A, 112B may be formed by adding a deep (i.e., high energy) p-type implant (e.g., boron) at zero degrees during a FET junction halo implant step. The p-type implant counter-dopes the regular source region near the buried oxide 120 interface into a p-type region 112B. By implanting at zero degrees, the deep implant does not impinge upon the channel region. The addition of the lightly-doped depleted p-type punchthrough region 112B should not add junction capacitance. Since the depletion region is in series with the buried oxide 120, the resulting junction capacitance should be reduced.

The modified lower region 112B of the source/base region 112 forms a punchthrough base region of the PNP bipolar transistor 152. Upon a region of the base tending to punchthrough, the collector current is dominated by the punchthrough region 112B of the source/base region 112. By employing a punchthrough region 112B, with a small emitter-base forward bias voltage, the collector current can be very large and less sensitive to the base width (i.e., the spacing between the p+ collector 111 and the p-type emitter 118).

Figure 6:
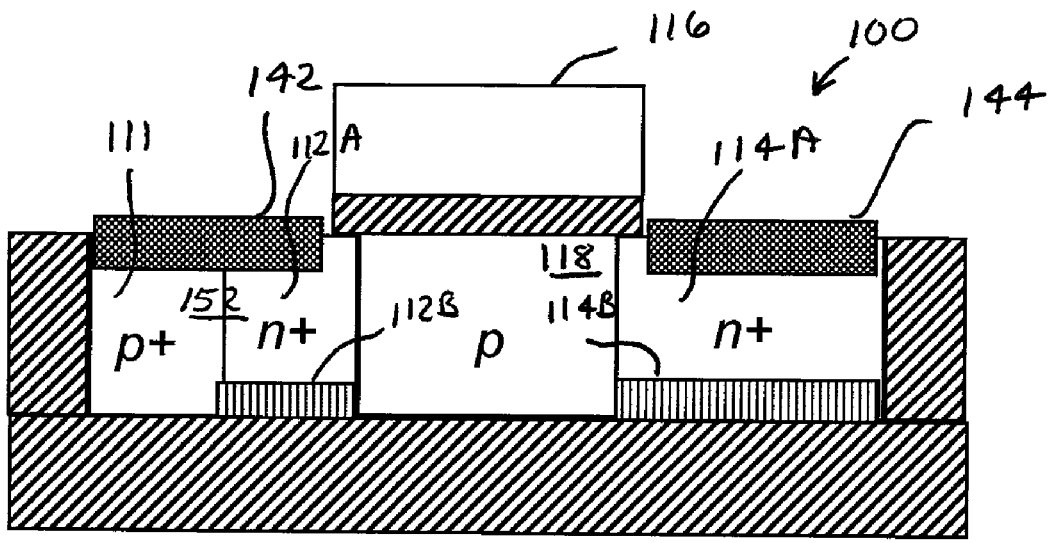
FIG. 6 is a cross-sectional view of a SOI transistor having a source-side merged lateral bipolar transistor and punchthrough regions in the base of the merged lateral bipolar transistor and in the drain region, in accordance with the inventive arrangements.

Referring to FIG. 6, yet another alternative embodiment of the SOI nFET 100 is illustrated. Similar to FIG. 5, the punchthrough region 112B of the source/base region 112 can be used in the drain region 114, such that the drain region 114 includes an upper region 114A and a lower/punchthrough region 114B. Since a punchthrough region is not anticipated to add junction capacitance, the addition of the drain punchthrough region 114B has little appreciable effect on the operation/characteristics of either the merged lateral bipolar transistor 152 or the drain 114. However, including the drain punchthrough region 114B can simplify the fabrication of the nFET 100. For example, the punchthrough regions 112B, 114B of both the source 112 and drain 114 can be introduced in a single step. On the contrary, if only the source 112 includes a punchthrough region 112B (e.g., FIG. 5), then an additional block out mask would likely have to be employed during fabrication.

Figure 7A:
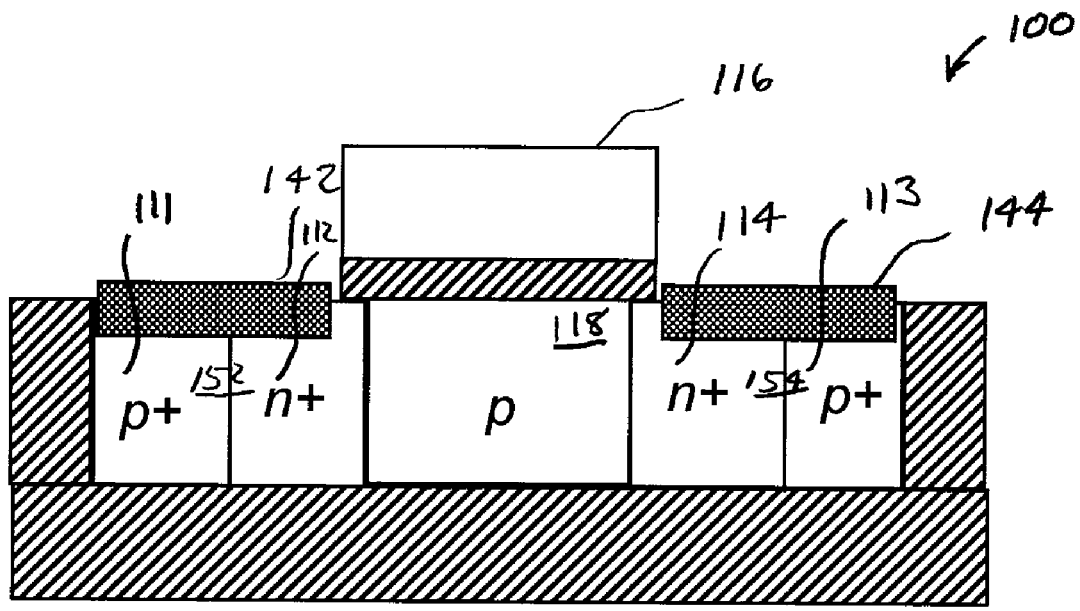
FIGS. 7A and 7B are cross-sectional views, respectively, of SOI transistors having symmetrical merged lateral bipolar transistors with and without symmetrical punchthrough regions, in accordance with the inventive arrangements.
Figure 7B:
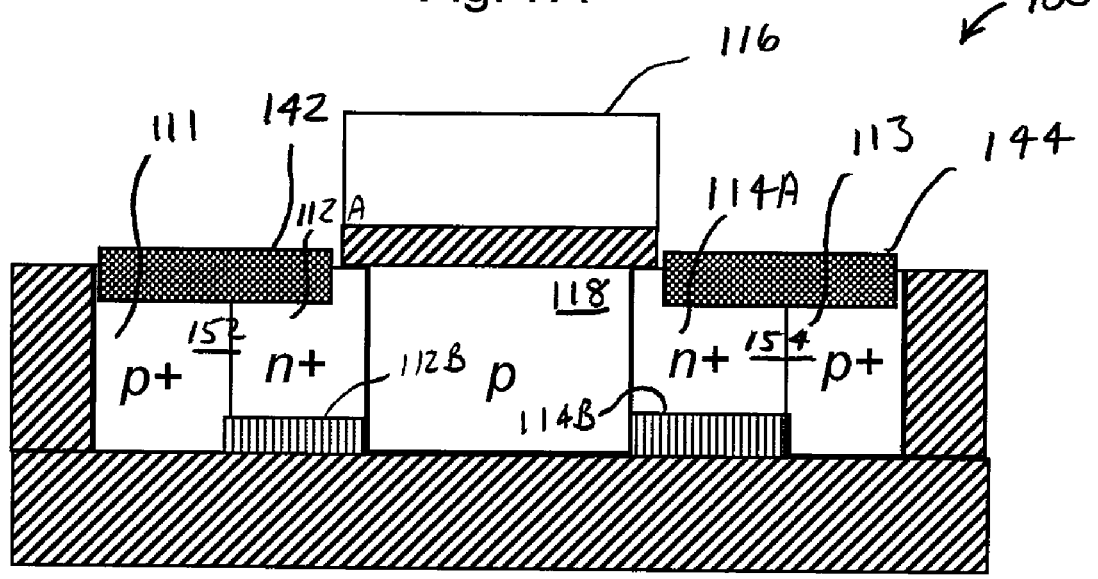

Referring to FIGS. 7A, 7B, additional alternative embodiments of the SOI nFET 100 are illustrated. Specifically, the source regions 112 and drain regions 114 are substantially symmetrical. Advantageously, by having symmetrical source/drain regions 112, 114, the nFET 100 can be operated with the source 112 and drain 114 interchanged and still benefit from the suppression of the floating-body effect. For example, in certain circuits, such as pass gates, the source 112 and drain 114 are operated in a substantially symmetrical manner Referring specifically to FIG. 7A, no punchthrough regions are illustrated, whereas punchthrough regions 112B, 114B are included in FIG. 7B. However, to obtain the substantially symmetrical source and drain regions 112, 114, the drain region 114 also includes a merged lateral bipolar transistor 154. The p-type region 113 and the n+ drain region 112 are electrically shorted together by the drain silicide region 144. However, in regular circuits, the p-type region 113 of the drain 114 has no effect on the operation or characteristics of the nFET 100 since the channel electrons flow from the source n+ region 112 to the drain n+ region 114.

What is claimed is:

1. A transistor device, comprising
a semiconductor-on-insulator substrate;
a source region having a first conductivity type;
a drain region;
a body region having a second conductivity type and positioned between the source region and the drain region; and
a source-side lateral bipolar transistor including a base, a collector, and an emitter.

2. The device of claim 1, further comprising a silicide region connecting the base to the collector.

3. The device of claim 1, wherein
the emitter is the body region,
the collector has the second conductivity type, and
the base is the source region and is positioned between the emitter and the collector.

4. The device of claim 1, wherein the source region include distinct upper and lower regions.

5. The device of claim 4, wherein
the upper region has the first conductivity type, and
the lower region has the first conductivity type with a lower doping density than the upper region.

6. The device of claim 4, wherein
the upper region has the first conductivity type, and
the lower region has the second conductivity type.

7. A transistor device, comprising
a semiconductor-on-insulator substrate;
a source region having a first conductivity type;
a drain region;
a body region having a second conductivity type and positioned between the source region and the drain region; and
a source-side lateral bipolar transistor including a base, a collector, and an emitter, wherein
the source region includes an upper region and a first punchthrough region.

8. The device of claim 7, further comprising a silicide region connecting the base to the collector.

9. The device of claim 7, wherein
the emitter is the body region,
the collector has the second conductivity type, and
the base is the source region and is positioned between the emitter and the collector.

10. The device of claim 7, wherein
the upper region has the first conductivity type, and
the first punchthrough region has the first conductivity type with a lower doping density than the upper region.

11. The device of claim 7, wherein
the upper region has the first conductivity type, and
the first punchthrough region has the second conductivity type.

12. The device of claim 7, further comprising
a second punchthrough region positioned within the drain region.

13. A transistor device, comprising
a semiconductor-on-insulator substrate;
a source region having a first conductivity type;
a drain region;
a body region having a second conductivity type and positioned between the source region and the drain region;
a source-side lateral bipolar transistor; and
a drain-side lateral bipolar transistor, wherein
each of the lateral bipolar transistors include a base, a collector, and an emitter.

14. The device of claim 13, further comprising a source-side and drain-side silicide regions connecting the base to the collector of the source-side lateral bipolar transistor and the drain-side lateral bipolar transistor.

15. The device of claim 13, wherein
the emitter of the source-side lateral bipolar transistor is the body region,
the collector of the source-side lateral bipolar transistor has the second conductivity type,
the base of the source-side lateral bipolar transistor is the source region and is positioned between the emitter and collector of the source-side lateral bipolar transistor,
the emitter of the drain-side lateral bipolar transistor is the body region,
the collector of the drain-side lateral bipolar transistor has the second conductivity type, and
the base of the drain-side lateral bipolar transistor is the drain region and is positioned between the emitter and the collector of the drain-side lateral bipolar transistor.

16. The device of claim 13, wherein the source and drain regions include distinct upper and lower regions.

17. The device of claim 16, wherein
the upper regions have the first conductivity type, and
the lower regions have the first conductivity type with a lower doping density than the upper regions.

18. The device of claim 16, wherein
the upper regions have the first conductivity type, and
the lower regions have the second conductivity type.

19. The device of claim 16, wherein the lower regions are punchthrough regions.

* * * * *